United States Patent
Shudo

(10) Patent No.: US 9,632,320 B2
(45) Date of Patent: Apr. 25, 2017

(54) LASER IRRADIATION DEVICE

(71) Applicant: SUMITOMO HEAVY INDUSTRIES, LTD., Tokyo (JP)

(72) Inventor: Kazumasa Shudo, Yokosuka (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/615,988

(22) Filed: Feb. 6, 2015

(65) Prior Publication Data

US 2015/0177525 A1    Jun. 25, 2015

Related U.S. Application Data

(63) Continuation of application No. PCT/JP2013/067762, filed on Jun. 28, 2013.

(30) Foreign Application Priority Data

Aug. 22, 2012 (JP) ................................. 2012-183240

(51) Int. Cl.
*G02B 27/12* (2006.01)
*H01L 21/268* (2006.01)
(Continued)

(52) U.S. Cl.
CPC ....... *G02B 27/123* (2013.01); *G02B 19/0057* (2013.01); *G02B 27/0927* (2013.01);
(Continued)

(58) Field of Classification Search
CPC ... H01S 5/405; H01S 5/4025; G02B 19/0057; G02B 19/0052
(Continued)

(56) References Cited

U.S. PATENT DOCUMENTS 5,959,779 A    9/1999   Yamazaki et al.
6,249,385 B1   6/2001   Yamazaki et al.
(Continued)

FOREIGN PATENT DOCUMENTS

CN    1498352 A      5/2004
EP    1 184 706 A2   3/2002
(Continued)

OTHER PUBLICATIONS

International Search Report dated Jul. 30, 2013 corresponding to International Patent Application No. PCT/ JP2013/067762 and English translation thereof.
(Continued)

*Primary Examiner* — Mahidere Sahle
(74) *Attorney, Agent, or Firm* — Squire Patton Boggs (US) LLP

(57) ABSTRACT

A semiconductor laser oscillator is formed by laser diodes arranged two-dimensionally in fast-axis and slow-axis directions. A laser beam emitted from the semiconductor laser oscillator is incident on a homogenizer. The homogenizer condenses the laser beam onto a long-length incident region at a surface to be irradiated. The homogenizer divides the laser beam into a plurality of beams with respect to a short-axis direction of the incident region, and superimposes the plurality of divided beams at the surface to be irradiated to cause the superimposed beams to be incident on the incident region. The slow-axis direction of the semiconductor laser oscillator is inclined with respect to a long-axis direction of the incident region.

3 Claims, 9 Drawing Sheets

(51) Int. Cl.
*H01L 21/324* (2006.01)
*H01L 29/66* (2006.01)
*G02B 19/00* (2006.01)
*G02B 27/09* (2006.01)
*H01S 5/40* (2006.01)
*H01S 5/022* (2006.01)

(52) U.S. Cl.
CPC ........ *G02B 27/0961* (2013.01); *H01L 21/268* (2013.01); *H01L 21/324* (2013.01); *H01L 29/66348* (2013.01); *H01S 5/4012* (2013.01); *H01S 5/02284* (2013.01)

(58) Field of Classification Search
USPC ............ 359/619–624, 639; 372/43.01, 50.12
See application file for complete search history.

(56) References Cited

U.S. PATENT DOCUMENTS

| | | | |
|---|---|---|---|
| 2002/0024740 A1 | 2/2002 | Hashimoto | |
| 2004/0081217 A1 | 4/2004 | Kusuyama | |
| 2006/0126690 A1* | 6/2006 | Kido | G02B 6/425 372/43.01 |
| 2006/0209310 A1 | 9/2006 | Muenz et al. | |
| 2009/0231718 A1 | 9/2009 | Muenz et al. | |
| 2011/0216417 A1 | 9/2011 | Chann et al. | |

FOREIGN PATENT DOCUMENTS

| | | |
|---|---|---|
| EP | 1 376 198 A1 | 1/2004 |
| EP | 2 450 737 A2 | 5/2012 |
| JP | 10-244392 A | 9/1998 |
| JP | 2002-072132 A | 3/2002 |
| JP | 2002-239773 A | 8/2002 |
| JP | 2004-096092 A | 3/2004 |
| JP | 2008-524662 A | 7/2008 |
| JP | 2009-016541 A | 1/2009 |
| JP | 2012-156390 A | 8/2012 |
| KR | 10-2003-0088478 A | 11/2003 |
| KR | 10-2007-0090246 A | 9/2007 |
| TW | 1361123 B | 4/2012 |
| WO | WO 02/077698 A1 | 10/2002 |
| WO | WO 2006/066706 A2 | 6/2006 |

OTHER PUBLICATIONS

Supplementary European Search Reported dated Apr. 19, 2016 corresponding to European Patent Application No. 13830899.4.

* cited by examiner

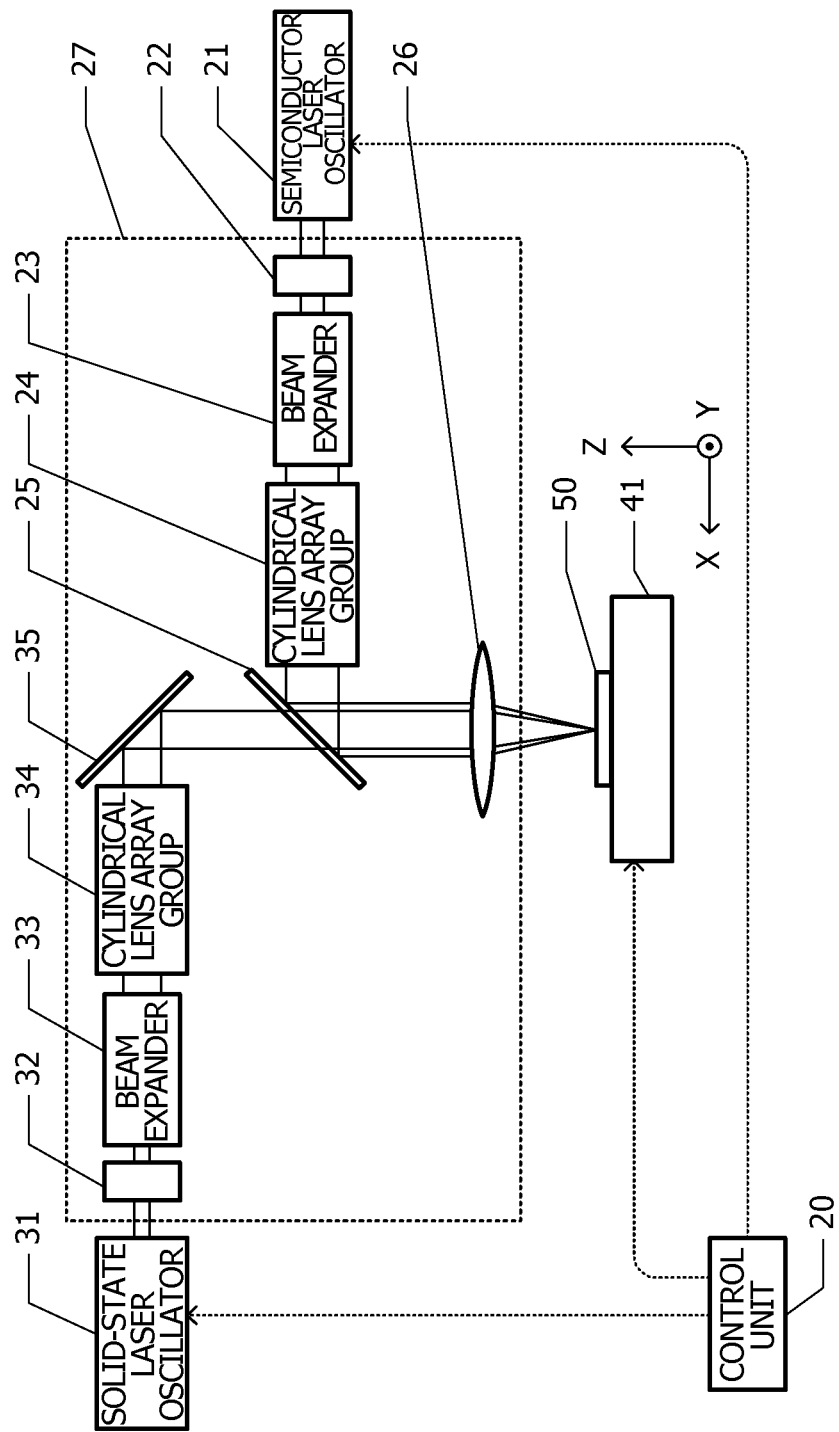

OVERLAPPING RATIO＝Wo/Wt

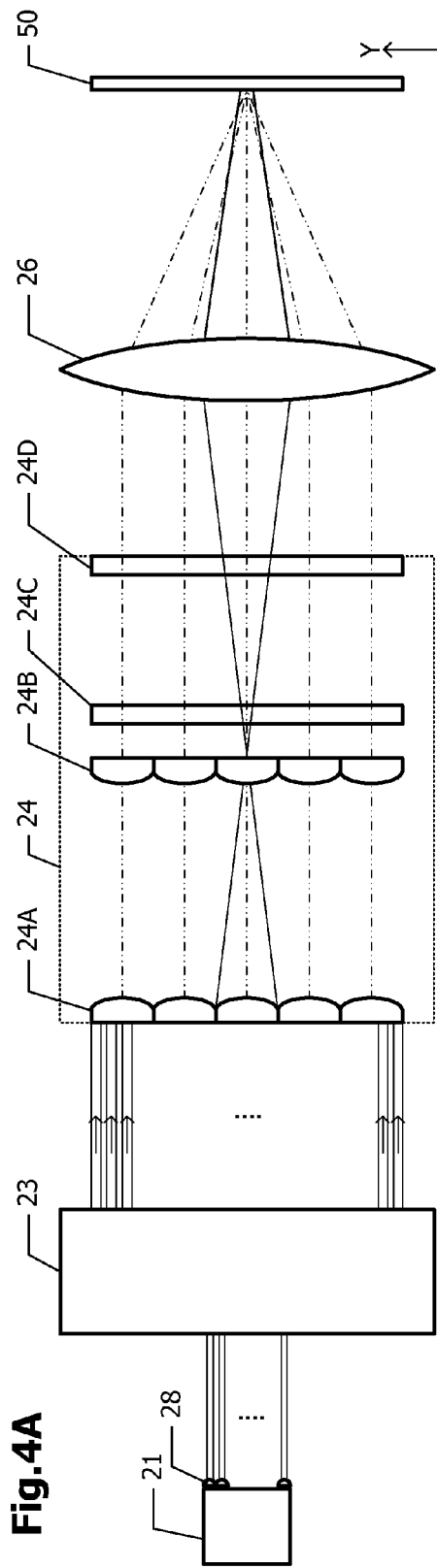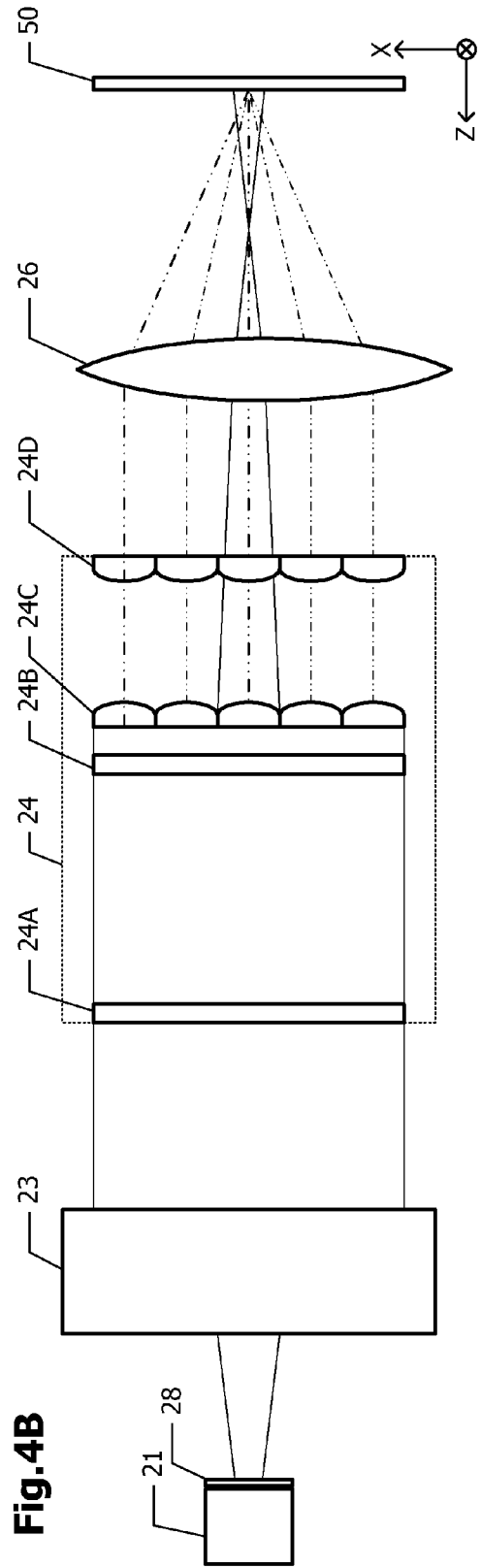

LASER IRRADIATION DEVICE

RELATED APPLICATIONS

Priority is claimed to Japanese Patent Application No. 2012-183240, filed Aug. 22, 2012, and International Patent Application No. PCT/JP2013/067762, the entire content of each of which is incorporated herein by reference.

BACKGROUND

Technical Field

The present invention relates to a laser irradiation device including a laser diode array in a light source.

Related Art

A carbon dioxide laser, a solid-state laser, an excimer laser, or the like is used in laser annealing of a semiconductor substrate. The light intensity distribution (beam profile) of a laser beam emitted from such a laser oscillator has generally a Gaussian shape. A laser beam having a beam profile uniformed by a homogenizer is caused to be incident on a semiconductor substrate, thereby allowing high-quality annealing to be performed.

In recent years, there has been progress in increasing the power of a laser diode array. A high-power laser diode array is used as a light source by which laser welding, laser cutting, solid-state laser excitation, and the like are performed.

SUMMARY

According to an embodiment of the present invention, there is provided a laser irradiation device including: a semiconductor laser oscillator having laser diodes arranged two-dimensionally in fast-axis and slow-axis directions; and a homogenizer to which a laser beam emitted from the semiconductor laser oscillator is incident, and which is configured to condense the laser beam onto a long-length incident region at a surface to be irradiated. The homogenizer divides the laser beam into a plurality of beams with respect to a short-axis direction of the incident region, and superimposes the plurality of divided beams at the surface to be irradiated to cause the superimposed beams to be incident on the incident region, and the slow-axis direction of the semiconductor laser oscillator is inclined with respect to a long-axis direction of the incident region.

BRIEF DESCRIPTION OF DRAWINGS

FIG. 1 is a schematic diagram illustrating a laser irradiation device according to an embodiment.

FIGS. 4A and 4B are longitudinal-sectional views illustrating a configuration of an optical system from a semiconductor laser oscillator of the laser irradiation device according to the embodiment to a semiconductor substrate.

DETAILED DESCRIPTION

Figure 2A:
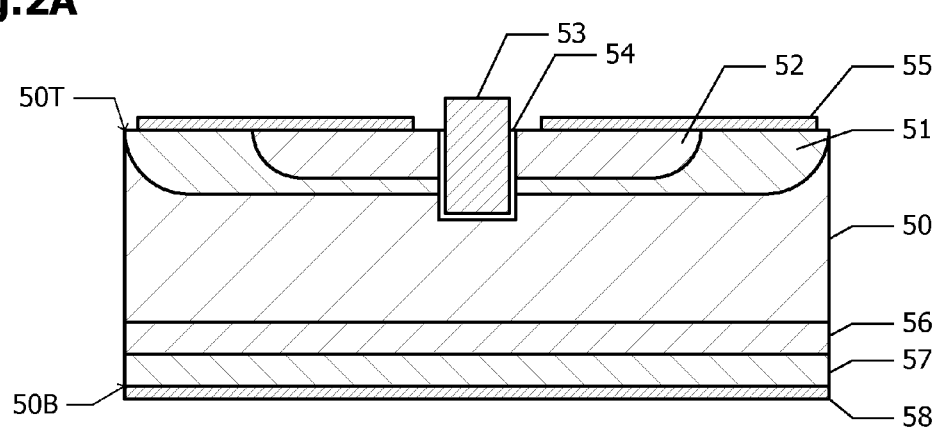
FIG. 2A is a cross-sectional view illustrating an IGBT which is manufactured by the laser irradiation device according to the embodiment.

A laser diode array has a structure in which a plurality of laser diodes are arranged one-dimensionally or two-dimensionally. For this reason, the beam profile of a laser beam emitted from the laser diode array has a shape depending on the arrangement of laser diodes without being formed in a Gaussian shape. Since it is difficult to uniform such a beam profile of the laser beam, the laser diode array is not used as a light source for laser annealing of a semiconductor substrate.

It is desirable to provide a laser irradiation device which is capable of enhancing the uniformity of a beam profile of a laser beam emitted from a laser diode array.

FIG. 1 illustrates a schematic diagram of a laser irradiation device according to an embodiment. This laser irradiation device is used in activation annealing of, for example, dopants implanted into a semiconductor wafer. A semiconductor laser oscillator 21 emits a quasi-continuous wave (QCW) laser beam having, for example, a wavelength of 808 nm. Meanwhile, a semiconductor laser oscillator that emits a pulsed laser beam having a wavelength of equal to or less than 950 nm may be used.

A laser diode array in which a plurality of laser diodes are arrayed two-dimensionally is used as the semiconductor laser oscillator 21. Hereinafter, the structure of the laser diode array will be described. A laser bar is formed by a plurality of laser diodes arrayed one-dimensionally in a monolithic manner. An array of laser diodes arrayed two-dimensionally is formed by stacking a plurality of laser bars. A direction in which a plurality of laser diodes constituting a laser bar are arranged is referred to as a slow axis. A direction in which a plurality of laser bars are stacked is referred to as a fast axis. A cylindrical lens is arranged for each laser bar. The cylindrical lens converges a laser beam emitted from the laser bar with respect to a fast-axis direction.

A solid-state laser oscillator 31 emits a pulsed laser beam of a green wavelength region. A Nd:YAG laser, a Nd:YLF laser, a Nd:YVO$_4$ laser, or the like that emits, for examples a second harmonic is used as the solid-state laser oscillator 31.

A pulsed laser beam emitted from the semiconductor laser oscillator 21 and a pulsed laser beam emitted from the solid-state laser oscillator 31 are incident on a semiconductor substrate 50 which is a target for annealing by way of a propagation optical system 27. The pulsed laser beam emitted from the semiconductor laser oscillator 21 and the pulsed laser beam emitted from the solid-state laser oscillator 31 are incident on the same region on the surface of the semiconductor substrate 50.

Next, the configuration and operations of the propagation optical system 27 will be described. The pulsed laser beam emitted from the semiconductor laser oscillator 21 is incident on the semiconductor substrate 50 by way of an attenuator 22, a beam expander 23, a cylindrical lens array group 24, a dichroic mirror 25, and a condensing lens 26.

The pulsed laser beam emitted from the solid-state laser oscillator 31 is incident on the semiconductor substrate 50 by way of an attenuator 32, a beam expander 33, a cylindrical lens array group 34, a bending mirror 35, the dichroic mirror 25, and the condensing lens 26.

Each of the beam expanders 23 and 33 collimates the incident pulsed laser beam, and expands the diameter of the beam. The cylindrical lens array groups 24 and 34, and the condensing lens 26 shape a beam cross-section on the surface of the semiconductor substrate 50 in a long-length form, and uniform a beam profile. The pulsed laser beam emitted from the semiconductor laser oscillator 21 and the pulsed laser beam emitted from the solid-state laser oscillator 31 are incident on substantially the same long-length region, on the surface of the semiconductor substrate 50. The cylindrical lens array group 24 and the condensing lens 26 function as a homogenizer for a laser beam emitted from the semiconductor laser oscillator 21, and the cylindrical lens array group 34 and the condensing lens 26 function as a homogenizer for a laser beam emitted from the solid-state laser oscillator 31. The homogenizer condenses the pulsed laser beam emitted from the semiconductor laser oscillator 21 and the pulsed laser beam emitted from the solid-state laser oscillator 31, onto the surface of the semiconductor substrate 50.

The semiconductor substrate 50 is held by a stage 41. An XYZ orthogonal coordinate system is defined in which a plane parallel to the surface of the semiconductor substrate 50 is set to an XY plane, and the normal direction of the surface of the semiconductor substrate 50 is set to a Z direction. A control unit 20 controls the semiconductor laser oscillator 21, the solid-state laser oscillator 31, and the stage 41. The stage 41 is controlled from the control unit 20, and moves the semiconductor substrate 50 in the X direction and the Y direction.

FIG. 2A illustrates a cross-sectional view of an insulated gate bipolar transistor (IGBT) as an example of a semiconductor device which is manufactured by the laser irradiation device according to an embodiment. The IGBT is created by forming an emitter and a gate on one surface (hereinafter, referred to as a "first surface") 50T of the semiconductor substrate 50 made of n-type silicon, and forming a collector on the other surface (hereinafter, referred to as a "second surface") 50B. As the semiconductor substrate 50, a silicon single crystal substrate is normally used. The structure of the surface having an emitter and a gate formed thereon is created by the same process as a process of creating a general MOSFET. For example, as shown in FIG. 2A, a p-type base region 51, an n-type emitter region 52, a gate electrode 53, a gate insulating film 54, and an emitter electrode 55 are arranged in a surface layer portion of the first surface 50T of the semiconductor substrate 50. The on-off control of a current can be performed using a gate-emitter voltage.

A p-type collector layer 57 and a low-concentration n-type buffer layer 56 are formed in a surface layer portion of the second surface 50B of the semiconductor substrate 50. The buffer layer 56 is arranged in a region deeper than the collector layer 57. The collector layer 57 and the buffer layer 56 are respectively formed by ion-implanting, for example, boron and phosphorus as dopants, and performing activation annealing. The laser irradiation device shown in FIG. 1 is applied to this activation annealing. A collector electrode 58 is formed on the surface of the collector layer 57 after the activation annealing.

The depth from the second surface 50B to an interface between the collector layer 57 and the buffer layer 56 is, for example, approximately 0.3 µm. The depth from the second surface to the deepest position of the buffer layer 56 is in a range of, for example, 1 µm to 5 µm.

Figure 2B:
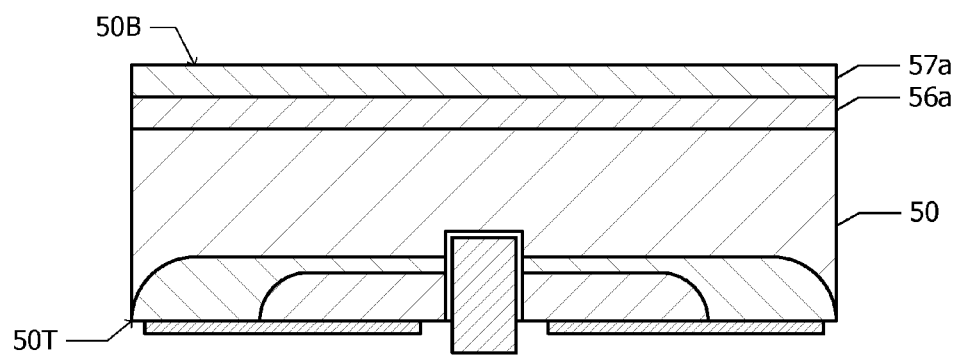
FIG. 2B is a cross-sectional view of the IGBT during manufacture.

FIG. 2B illustrates a cross-sectional view of the semiconductor substrate 50 in a step of performing laser annealing. Boron is ion-implanted into a surface layer portion 57a of the second surface 50B of the semiconductor substrate 50. Phosphorus is ion-implanted into a region 56a deeper than the surface layer portion 57a. Boron within the surface layer portion 57a and phosphorus within the deep region 56a are not activated. The boron concentration of the surface layer portion 57a is higher than the phosphorus concentration of the deep region 56a. In the specification, the surface layer portion 57a is referred to as a "high-concentration layer", and the deep region 56a is referred to as a "low-concentration layer". Since the dose amount of boron is large, the high-concentration layer 57a is in an amorphous state. A region deeper than an interface between the high-concentration layer 57a and the low-concentration layer 56a remains in a single-crystal state. An element structure shown in FIG. 2A is formed on the first surface 50T of the semiconductor substrate 50.

Figure 3A:
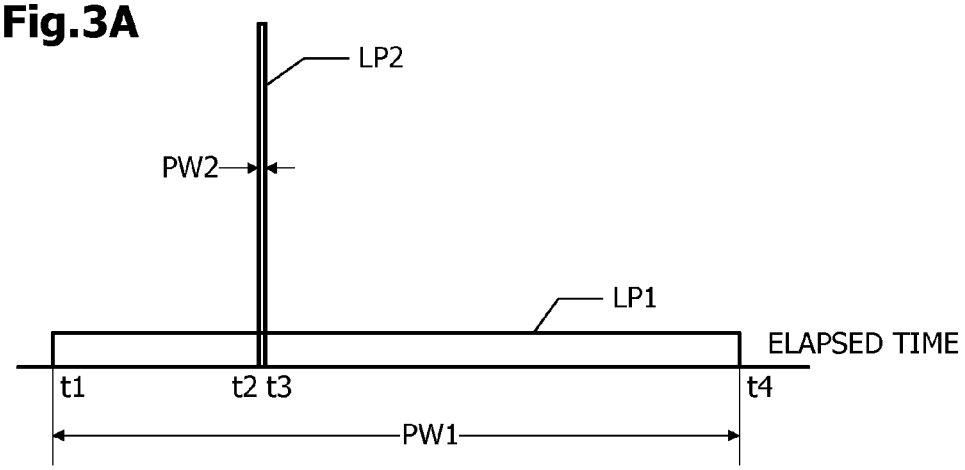
FIG. 3A is a graph illustrating an example of time waveforms of first and second laser pulses which are emitted by the laser irradiation device according to the embodiment.

FIG. 3A illustrates an outline of waveforms of laser pulses which are incident on the semiconductor substrate 50 (FIG. 2B). In FIG. 3A, a pulse waveform is represented by a rectangular shape, but an actual pulse waveform includes portions of the rise, attenuation, drop and the like of the pulse. The emission timing of the pulse waveforms shown in FIG. 3A is determined by the control unit 20 (FIG. 1) controlling the semiconductor laser oscillator 21 and the solid-state laser oscillator 31.

At time t1, the incidence of a first laser pulse LP1 emitted from the semiconductor laser oscillator 21 on the semiconductor substrate 50 is started. At time t2 after time t1, a second laser pulse LP2 emitted from the solid-state laser oscillator 31 is incident on the semiconductor substrate 50. Regions on which the first laser pulse LP1 and the second laser pulse LP2 are incident substantially overlap each other. The peak power of the second laser pulse LP2 is higher than the peak power of the first laser pulse LP1, and a pulse width PW2 of the second laser pulse LP2 is shorter than a pulse width PW1 of the first laser pulse LP1. At time t3, the incidence of the second laser pulse LP2 is terminated. Thereafter, at time t4, the incidence of the first laser pulse LP1 is terminated. Meanwhile, after time t4, the second laser pulse LP2 may be caused to be incident.

The pulse width PW1 of the first laser pulse LP1 is, for example, equal to or greater than 10 μs. The pulse width PW2 of the second laser pulse LP2 is, for example, equal to or less than 1 μs. As an example, the pulse width PW1 is in a range of 10 μs to 30 μs, and the pulse width PW2 is in a range of 100 ns to 200 ns. It is preferable that the pulse width PW2 of the second laser pulse LP2 be set to be equal to or less than 1/10 of the pulse width PW1 of the first laser pulse LP1.

Figure 3B:
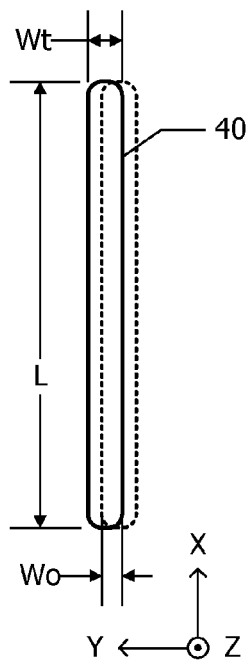
FIG. 3B is a plan view illustrating an incident region of the laser pulse.

FIG. 3B illustrates a plan view of an incident region of a laser pulse on the second surface 50B (FIG. 2B) of the semiconductor substrate 50 (FIG. 2B). The first laser pulse LP1 (FIG. 3A) and the second laser pulse LP2 (FIG. 3A) are incident on the same beam incident region 40 which is long in the X direction, on the second surface 50B (FIG. 2B) of the semiconductor substrate 50. For example, the suitable length L and width Wt of the beam incident region 40 are 2 mm to 4 mm and 200 μm to 400 μm, respectively.

While the semiconductor substrate 50 (FIG. 2B) is moved in the Y direction during annealing, the first laser pulse LP1 and the second laser pulse LP2 (FIG. 3A) are caused to be incident on the semiconductor substrate 50 at a constant repetition frequency. A distance by which the semiconductor substrate 50 moves during one period with respect to the repetition frequency of the first laser pulse LP1 and the second laser pulse LP2 is denoted by Wo. Two beam incident regions 40 of the first laser pulse LP1 which are next to each other on the time axis partially overlap each other. The overlapping ratio Wo/Wt of both regions is, for example, 50%.

When the incidence of the first laser pulse LP1 at time t1 shown in FIG. 3A is started, the temperature of the surface layer portion on the second surface 50B (FIG. 2B) of the semiconductor substrate 50 starts to rise. At a point in time t2, the temperature of the second surface 50B of the semiconductor substrate 50 does not reach the melting point (1300 K to 1430 K) of amorphous silicon. When the second laser pulse LP2 is caused to be incident at time t2, the temperature of the surface layer portion on the second surface 50B of the semiconductor substrate 50 reaches the melting point of amorphous silicon, and the surface layer portion is melted. The melted portion reaches the bottom of the high-concentration layer 57a (FIG. 2B).

When the incidence of the second laser pulse LP2 is terminated, the temperature of the surface layer portion of the semiconductor substrate 50 drops, and the surface layer portion is solidified. In this case, a crystal is epitaxially grown from the single-crystal low-concentration layer 56a (FIG. 2B), and thus the high-concentration layer 57a is formed in a single crystal. Simultaneously, dopants which are implanted into the high-concentration layer 57a are activated.

Since the incidence of the first laser pulse LP1 (FIG. 3A) continues even after time t3, regions from the second surface 50B of the semiconductor substrate 50 to the deep low-concentration layer 56a (FIG. 2B) are heated, and the temperature rises. Thereby, dopants which are implanted into the low-concentration layer 56a are activated. At the point in time when the incidence of the first laser pulse LP1 is terminated at time t4, the temperature of the second surface 50B of the semiconductor substrate 50 does not reach the melting point of single crystal silicon. For this reason, the recrystallized surface layer portion of the second surface 50B of the semiconductor substrate 50 is not re-melted.

When the second laser pulse LP2 is caused to be incident after time t4, dopants within the low-concentration layer 56a (FIG. 2B) are activated by irradiation of the first laser pulse LP1. Thereafter, the high-concentration layer 57a (FIG. 2B) is melted by irradiation of the second laser pulse LP2. When the high-concentration layer 57a is recrystallized, dopants within the high-concentration layer 57a are activated.

Figure 3C:
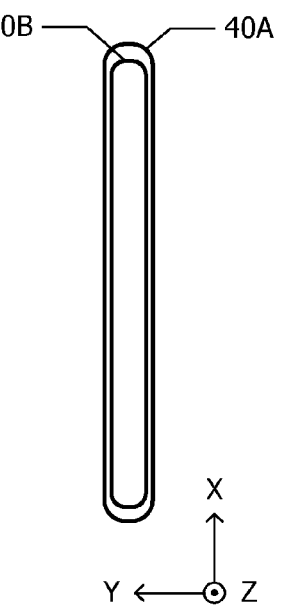
FIG. 3C is a plan view illustrating another configuration example of the incident region of the laser pulse.

In FIG. 3B, the beam incident region 40 of the first laser pulse LP1 and the beam incident region 40 of the second laser pulse LP2 on the surface of the semiconductor substrate 50 are made substantially coincident with each other, but both the two are not necessarily required to be coincident with each other. As shown in FIG. 3C, the beam incident region 40A of the first laser pulse LP1 may be made slightly larger than the beam incident region 40B of the second laser pulse LP2. In this case, the beam incident region 40B of the second laser pulse LP2 is included in the beam incident region 40A of the first laser pulse LP1.

FIGS. 4A and 4B illustrate longitudinal-sectional views of an optical system on a path of the first laser pulse from the semiconductor laser oscillator 21 to the semiconductor substrate 50. FIG. 4A illustrates a longitudinal-sectional view parallel to a YZ plane, that is, a longitudinal-sectional view parallel to the short-axis direction of the beam incident region 40 (FIG. 3B). FIG. 4B illustrates a longitudinal-sectional view parallel to a ZX plane, that is, a longitudinal-sectional view parallel to the long-axis direction of the beam incident region 40 (FIG. 3B). As shown in FIG. 1, the direction of travel of the laser beam is changed by the dichroic mirror 25 and the bending mirror 35. The direction of each coordinate axis of the XYZ orthogonal coordinate system is also assumed to be changed following a change in the direction of travel of the laser beam.

A laser diode array is used as the semiconductor laser oscillator 21. This laser diode array includes a plurality of laser diodes which are arranged two-dimensionally in the X direction and the Y direction. The fast axis and the slow axis of the laser diode array are arranged substantially parallel to the Y direction and the X direction, respectively. As described later, the fast axis and the Y direction, and the slow axis and the X direction, strictly, deviate slightly from a parallel relation. The laser beam emitted from the semiconductor laser oscillator 21 is incident on a fast-axis cylindrical lens array 28.

The fast-axis cylindrical lens array 28 is constituted by a cylindrical lens arranged for each column of laser diodes which are lined up in a slow-axis direction. As shown in FIG. 4A, the cylindrical lens converges the laser beam emitted from the semiconductor laser oscillator 21 with respect to the fast-axis direction (with respect to the YZ in-plane). As shown in FIG. 4B, the laser beam propagates with a certain spread angle with respect to the slow-axis direction. The beam expander 23 expands the cross-section of the laser beam, and collimates the laser beam. The collimated laser beam is incident on the cylindrical lens array group 24.

Figure 5A:
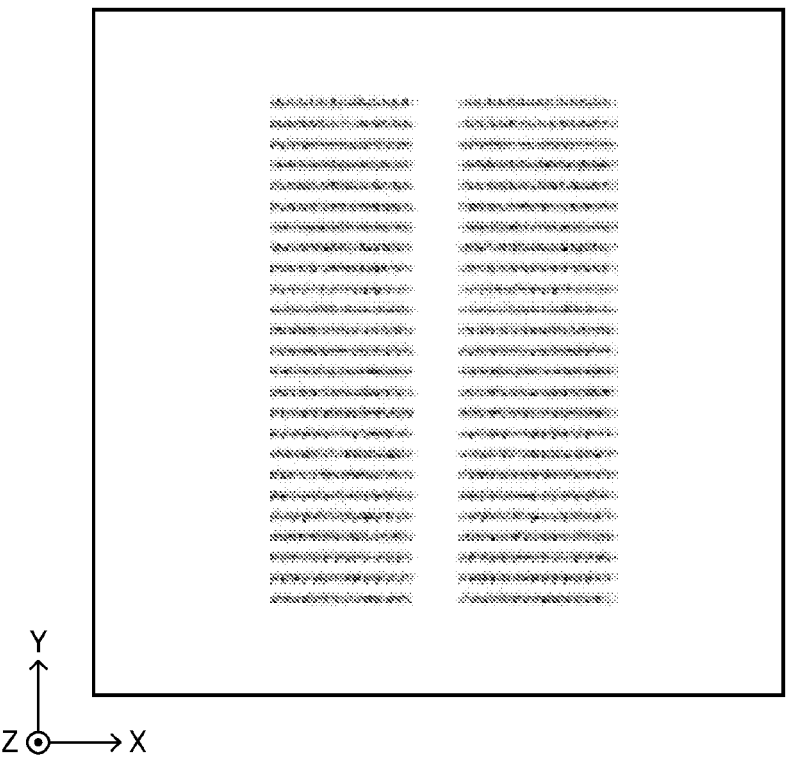
FIGS. 5A and 5B are schematic diagrams illustrating a two-dimensional profile of a laser beam at an emission position of the semiconductor laser oscillator and an incident position of a cylindrical lens array group when a slow axis from the semiconductor laser oscillator is arranged in parallel to an X direction.
Figure 5B:
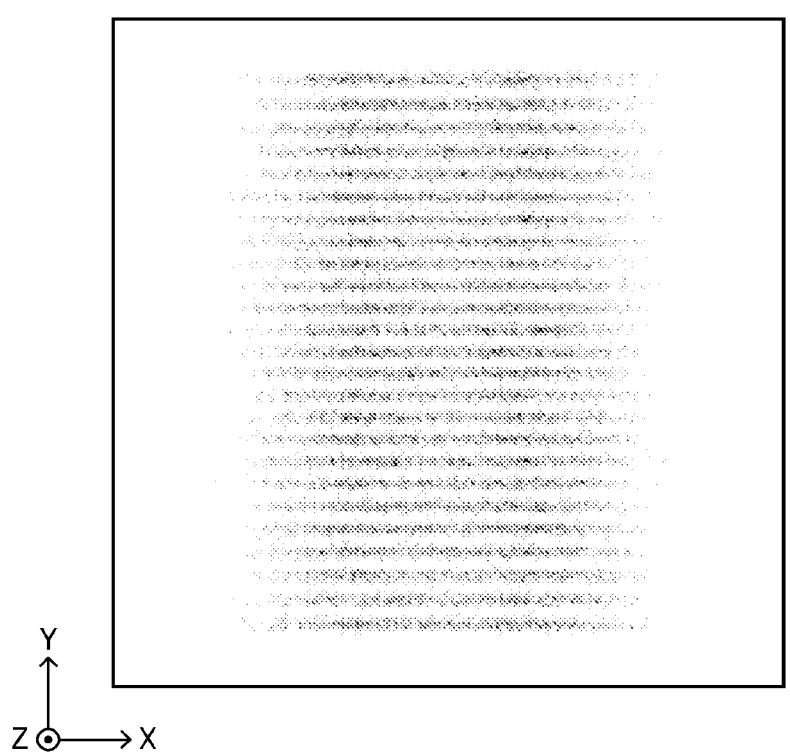

FIGS. 5A and 5B illustrate two-dimensional profiles of the laser beam when the slow axis of the semiconductor laser oscillator 21 is arranged in parallel to the X direction. FIG. 5A illustrates a two-dimensional profile at an emission position from the semiconductor laser oscillator 21, and FIG. 5B illustrates a two-dimensional profile at an incident position on the cylindrical lens array group 24. A region having high light intensity is represented by a dark color.

As shown in FIG. 5A, the two-dimensional profile at the emission position of the semiconductor laser oscillator 21 includes two sets of stripe-like patterns arranged at a certain interval in the X direction. Each of the stripes constituting the stripe-like pattern corresponds to a laser bar which is made of a plurality of laser diodes arranged in the X direction. Each of the stripe-like patterns corresponds to a laser stack including a plurality of, for example, twenty-five laser bars stacked in the Y direction. In an example shown in FIG. 5A, two laser stacks are arranged at a certain interval in the X direction.

As shown in FIG. 5B, at the incident position of the cylindrical lens array group 24, the respective stripes of two stripe-like patterns extend in the X direction and continue with each other, to form one stripe-like pattern.

Figure 6A:
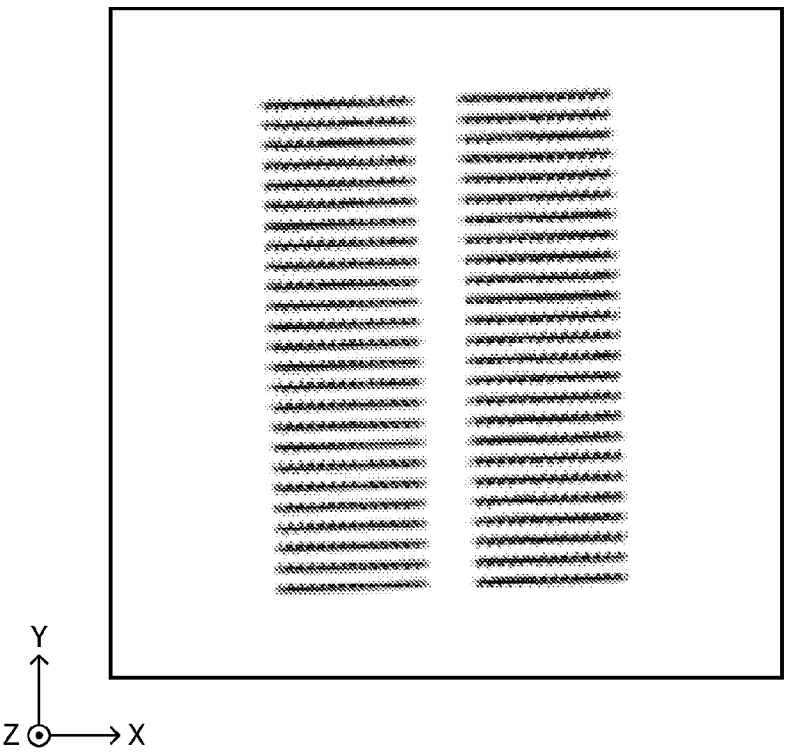
FIGS. 6A and 6B are schematic diagrams illustrating a two-dimensional profile of a laser beam at the emission position of the semiconductor laser oscillator and the incident position of the cylindrical lens array group in the laser irradiation device according to the embodiment.
Figure 6B:
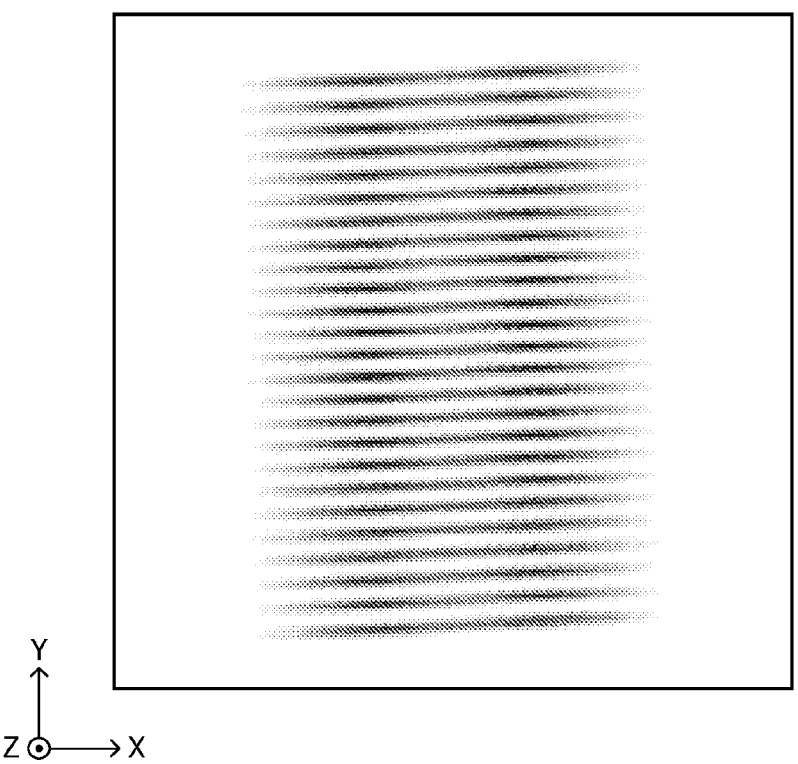

FIGS. 6A and 6B illustrate two-dimensional profiles of a laser beam of the semiconductor laser oscillator 21 according to the embodiment. FIG. 6A illustrates a two-dimensional profile at an emission position from the semiconductor laser oscillator 21, and FIG. 6B illustrates a two-dimensional profile at an incident position on the cylindrical lens array group 24. The slow axis of the laser diode array constituting the semiconductor laser oscillator 21 is inclined slightly with respect to the X direction.

As shown in FIG. 4A, the cylindrical lens array group 24 includes first to fourth cylindrical lens arrays 24A to 24D. The first and second cylindrical lens arrays 24A and 24B have a configuration in which a plurality of cylindrical lenses having a cylindrical surface parallel to the X direction are arranged in the Y direction. The third and fourth cylindrical lens arrays 24C and 24D have a configuration in which a plurality of cylindrical lenses having a cylindrical surface parallel to the Y direction are arranged in the X direction.

The first and second cylindrical lens arrays 24A and 24B divide the laser beam having a stripe-like two-dimensional profile (FIG. 6B) into a plurality of beams with respect to the Y direction. Each of the first and second cylindrical lens arrays 24A and 24B is constituted by, for example, five cylindrical lenses. In this case, the laser beams emitted from five laser bars out of twenty-five laser bars of the semiconductor laser oscillator 21 are incident on one cylindrical lens. Meanwhile, a correspondence relationship between the number of laser bars and the number of cylindrical lenses is arbitrary, and the number of laser bars is not required to be divisible by the number of cylindrical lenses.

The third and fourth cylindrical lens arrays 24C and 24D have no influence on the divergence and convergence of the laser beam with respect to the Y direction. The condensing lens 26 superimposes a plurality of beams divided with respect to the Y direction on the surface of the semiconductor substrate 50. As an example, the first and second cylindrical lens arrays 24A and 24B and the condensing lens 26 have a positional relationship in which the first cylindrical lens array 24A is imaged on the surface of the semiconductor substrate 50 by the second cylindrical lens array 24B and the condensing lens 26, with respect to the Y direction.

As shown in FIG. 4B, the third and fourth cylindrical lens arrays 24C and 24D divide the laser beam into a plurality of beams with respect to the X direction. The condensing lens 26 superimposes the laser beams divided in the X direction on the surface (surface to be irradiated) of the semiconductor substrate 50. As an example, the third and fourth cylindrical lens arrays 24C and 24D and the condensing lens 26 have a positional relationship in which the third cylindrical lens array 24C is imaged on the surface of the semiconductor substrate 50 by the fourth cylindrical lens array 24D and the condensing lens 26, with respect to the X direction.

Imaging magnification with respect to the Y direction is made smaller than imaging magnification with respect to the X direction, and thus the laser beam can be caused to be incident on the inside of the beam incident region 40 (FIG. 3B) which is long in the X direction.

When the beam profile of the laser beam incident on the cylindrical lens array group 24 has a Gaussian shape, a plurality of beams divided by the cylindrical lens array group 24 are superimposed on the surface of the semiconductor substrate 50, thereby allowing the beam profile to be uniformed with respect to the X direction and the Y direction. However, the two-dimensional profile of the laser beam which is emitted from the semiconductor laser oscillator 21 used in the laser irradiation device according to the embodiment does not have a Gaussian shape as shown in FIG. 6A.

Figure 7A:
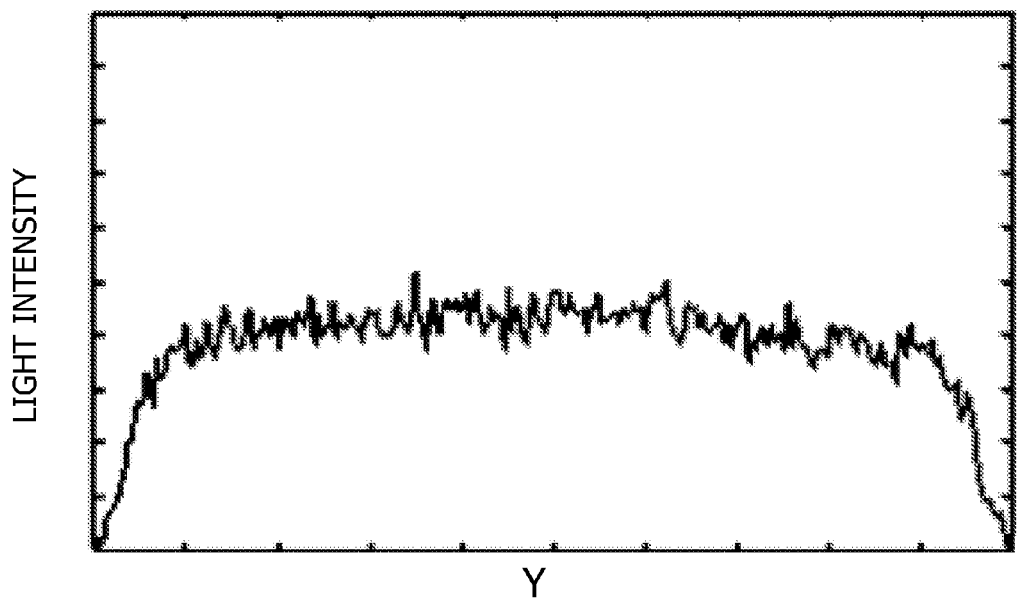
FIGS. 7A and 7B are graphs illustrating a beam profile on the surface of a semiconductor substrate in a short-axis direction when the laser beam having the two-dimensional profiles shown in FIGS. 5B and 6B are incident on a homogenizer.
Figure 7B:
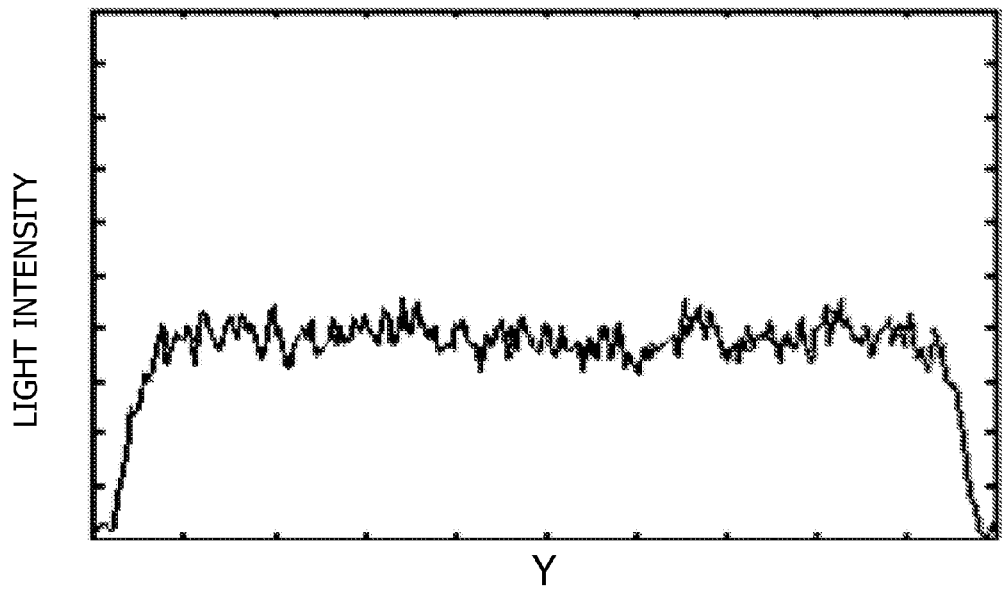

FIG. 7A illustrates a beam profile on the surface of the semiconductor substrate 50 with respect to the Y direction (short-axis direction) when the laser beam having two-dimensional profiles shown in FIGS. 5A and 5B is used. FIG. 7B illustrates a beam profile on the surface of the semiconductor substrate 50 with respect to the Y direction (short-axis direction) when the laser beam having two-dimensional profiles shown in FIGS. 6A and 6B is used, that is, when the laser irradiation device according to the embodiment is used. When FIGS. 7A and 7B are compared with each other, it can be understood that the uniformity of the beam profile in FIG. 7B is higher. As shown in FIGS. 6A and 6B, it is considered that the uniformity becomes higher since the slow-axis direction of the semiconductor laser oscillator 21 is inclined with respect to the X direction.

A relationship between the inclined angle of the slow-axis direction with respect to the X direction and the uniformity of the beam profile will be described with reference to FIGS. 8A and 8B.

Figure 8A:
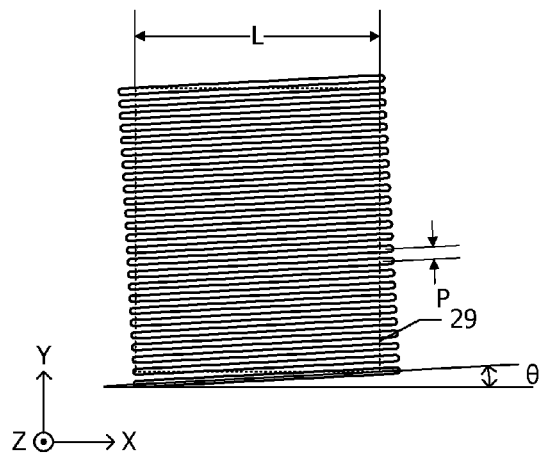
FIG. 8A is a diagram illustrating a relative positional relationship among a two-dimensional profile of a laser beam at the incident position of the cylindrical lens array group, a rectangular opening of the cylindrical lens array group, and an XYZ coordinate system.

FIG. 8A illustrates a positional relationship among a two-dimensional profile of a laser beam at the incident position of the cylindrical lens array group 24, a rectangular opening of the cylindrical lens array group 24, and an XYZ coordinate system. The inclined angle of the slow-axis direction with respect to the X direction is denoted by θ. A pair of sides of a rectangular opening 29 of the cylindrical lens array group 24 are parallel to the X direction, and the other pair of sides are parallel to the Y direction. The laser beam incident on the inside of the rectangular opening 29 reaches the surface of the semiconductor substrate 50 without generating shading in a subsequent optical system. The dimension of the rectangular opening 29 in the X direction is denoted by L. The pitch (period) of the stripe-like pattern in the fast-axis direction is denoted by P.

Figure 8B:
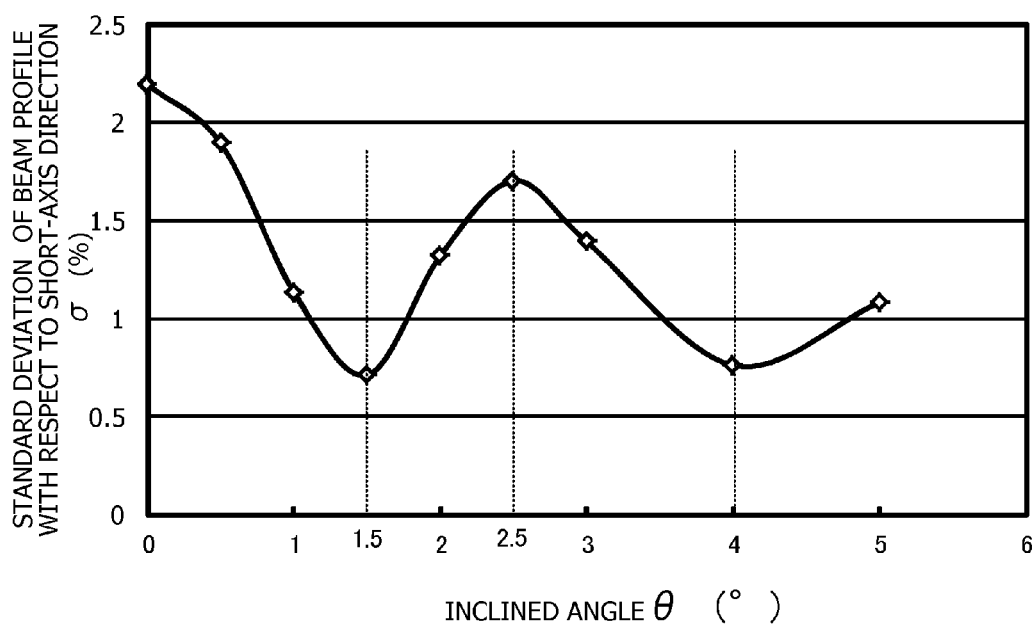
FIG. 8B is a graph illustrating a relationship between an inclined angle $\theta$ and a standard deviation $\sigma$ of a beam profile with respect to a short-axis direction.

FIG. 8B illustrates a relationship between an inclined angle θ and standard deviation σ of the beam profile in the Y direction (short-axis direction) in the beam incident region 40 (FIG. 3B). The inclined angle θ of the horizontal axis is denoted in units of "°", and the standard deviation σ of the vertical axis is denoted in units of "%". A point at which the inclined angle θ is 0° corresponds to a reference example shown in FIGS. 5A and 5B. When the inclined angle θ is made gradually larger than 0°, the standard deviation σ repeats decrease and increase. In an example shown in FIG. 8B, the standard deviation σ shows a minimum value at the inclined angle θ of approximately 1.5° and approximately 4°, and shows a maximum value at the inclined angle θ of approximately 2.5°.

A reason for the standard deviation σ repeating increase and decrease with an increase in inclined angle θ will be described with reference to FIGS. 9A to 9H. FIGS. 9A, 9C, 9E, and 9G illustrate positional relationships between the two-dimensional profile of the laser beam and the XYZ coordinate system, and FIGS. 9B, 9D, 9F, and 9H illustrate waveforms of an integrated value, obtained by integrating light intensity in the X direction, with respect to the Y direction.

Figure 9A:
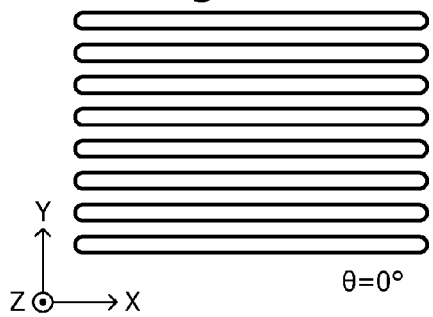
FIGS. 9A, 9C, 9E, and 9G are schematic diagrams illustrating a positional relationship between a two-dimensional profile and the XYZ coordinate system.
Figure 9B:
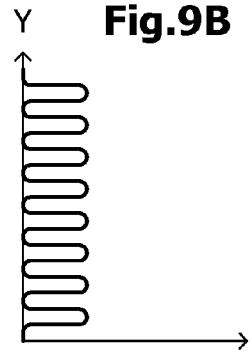
FIGS. 9B, 9D, 9F, and 9H are graphs illustrating a waveform of an integrated value, obtained by integrating light intensity in an X direction, with respect to a Y direction.

When the light intensity is integrated in the X direction at the inclined angle θ of 0° as shown in FIG. 9A, the integrated value shows a periodic waveform with respect to the Y direction as shown in FIG. 9B. Such a period is equal to the pitch P (FIG. 8A) of the stripe-like pattern in the fast-axis direction. That is, the two-dimensional profile of the laser beam shows a maximum value periodically at the pitch P with respect to the fast-axis direction.

Figure 9C:
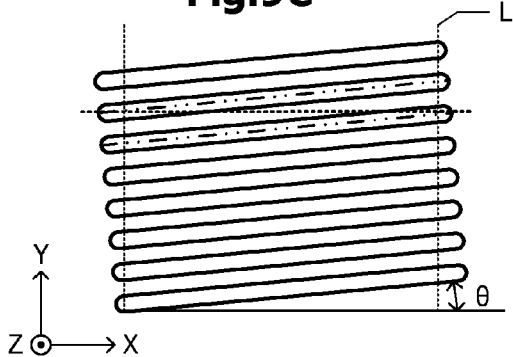
Figure 9D:
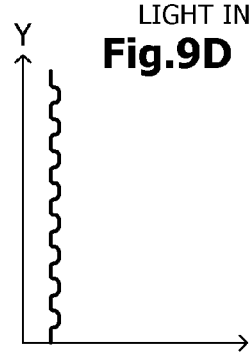

In FIG. 9C, the inclined angle θ is made larger until the Y coordinate of the left end of one stripe within the rectangular opening 29 and the Y coordinate of the right end of a stripe adjacent thereto become equal to each other. In this case, as shown in FIG. 9D, the amplitude of the waveform of the integrated value obtained by integrating the light intensity in the X direction becomes smaller. The inclined angle θ in this case is represented by $\sin^{-1}(P/L)$.

Figure 9E:
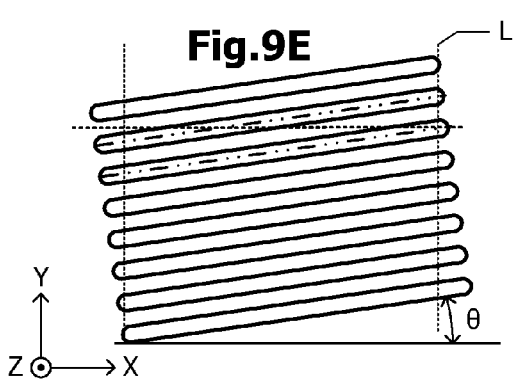
Figure 9F:
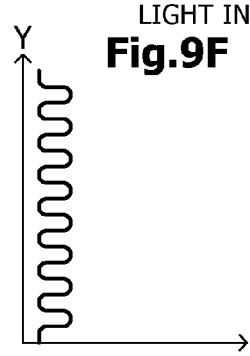
Figure 9G:
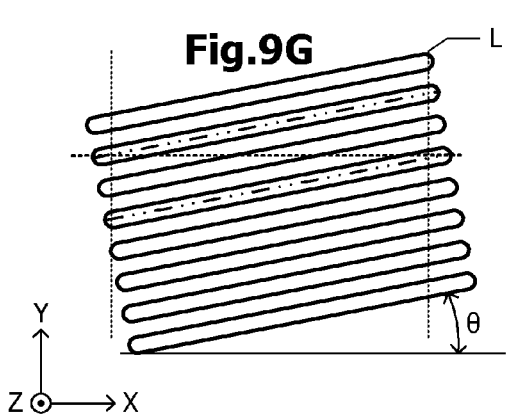
Figure 9H:
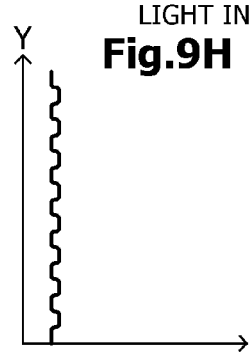

When the inclined angle θ is made still larger as shown in FIG. 9E, the amplitude of the waveform of the integrated value becomes larger as shown in FIG. 9F. When the inclined angle θ is made larger until the Y coordinate of the left end of one stripe within the rectangular opening 29 and the Y coordinate of the right end of a stripe next but one thereto with one stripe interposed therebetween as shown in FIG. 9G become equal to each other, the amplitude of the waveform of the integrated value becomes smaller as shown in FIG. 9H.

As described above, when the inclined angle θ is made gradually larger than 0°, the amplitude of the waveform of the integrated value repeats increase and decrease. This increase and decrease in the amplitude of the waveform of the integrated value is considered to be reflected in the increase and decrease in standard deviation σ shown in FIG. 8B. In FIG. 8B, the inclined angle θ at which the standard deviation σ initially shows a minimum value corresponds to a state shown in FIG. 9C, and is substantially equal to $\sin^{-1}(P/L)$. In order to enhance the uniformity of the beam profile with respect to the Y direction, it is preferable to set the inclined angle θ to $\sin^{-1}(P/L)$. In addition, from the results shown in FIG. 8B, it can be understood that a beam profile having sufficiently high uniformity is obtained in a range where the inclined angle θ is 0.5 times to 1.5 times $\sin^{-1}(P/L)$.

Even when the inclined angle θ is about 4°, a beam profile having sufficiently high uniformity is obtained. However, in a laser beam which is emitted from a general laser diode array, the quality of a beam with respect to a longitudinal-section perpendicular to the fast-axis direction is worse than the quality of a beam with respect to a longitudinal-section perpendicular to the slow-axis direction. When the inclined angle θ becomes larger, there are more beam components having a poor quality with respect to the longitudinal-section (YZ longitudinal-section shown in FIG. 4A) parallel to the short-axis direction. In order to obtain a high-quality laser beam with respect to the short-axis direction, it is preferable to make the inclined angle θ as small as possible. Specifically, it is preferable that the inclined angle θ be set to be about an angle of 1.5° at which the standard deviation σ initially takes a minimum value rather than to be about an angle of 4° at which the standard deviation secondly takes a minimum value.

As shown in FIG. 6B, the periodicity of light intensity distribution is weak with respect to the long-axis direction (X direction). For this reason, a beam profile having sufficiently high uniformity equivalent to using a Gaussian beam is obtained with respect to the long-axis direction (X direction).

It should be understood that the invention is not limited to the above-described embodiment, but may be modified into various forms on the basis of the spirit of the invention. Additionally, the modifications are included in the scope of the invention.

REFERENCE SIGNS LIST

20: control unit
21: semiconductor laser oscillator
22: attenuator
23: beam expander
24: cylindrical lens array group
24A: first cylindrical lens array
24B: second cylindrical lens array
24C: third cylindrical lens array
24D: fourth cylindrical lens array
25: dichroic mirror
26: condensing lens
27: propagation optical system
28: fast-axis cylindrical lens array
29: rectangular opening
31: solid-state laser oscillator
32: attenuator
33: beam expander
34: cylindrical lens array group
35: bending mirror
40: beam incident region
40A: beam incident region of first laser pulse
40B: beam incident region of second laser pulse
41: stage
50: semiconductor substrate
50T: first surface
50B: second surface
51: p-type base region
52: n-type emitter region
53: gate electrode
54: gate insulating film
55: emitter electrode
56: n-type buffer layer
56a: low-concentration layer
57: p-type buffer layer
57a: high-concentration layer
58: collector electrode

What is claimed is:

1. A laser irradiation device comprising:
a semiconductor laser oscillator having laser diodes arranged two-dimensionally in fast-axis and slow-axis directions; and
a homogenizer to which a laser beam emitted from the semiconductor laser oscillator is incident, and which is configured to condense the laser beam onto a long-length incident region at a surface to be irradiated,
wherein the homogenizer divides the laser beam into a plurality of beams with respect to a short-axis direction of the incident region, and superimposes the plurality of divided beams on the surface to be irradiated to cause the superimposed beams to be incident on the incident region, and
the slow-axis direction of the semiconductor laser oscillator is inclined with respect to a long-axis direction of the incident region,
wherein at an incident position to the homogenizer, a profile of the laser beam shows a maximum value periodically at a pitch P with respect to the fast-axis direction, and when a dimension of a cross-section of the laser beam at the incident position to the homogenizer in the long-axis direction is denoted by L, and an inclined angle between the slow-axis direction of the semiconductor laser oscillator and the long-axis direction is denoted by $\theta$, the inclined angle $\theta$ is in a range of 0.5 times to 1.5 times $\sin^{-1}(P/L)$.

2. The laser irradiation device according to claim 1, wherein the homogenizer further divides the laser beam into a plurality of beams with respect to the long-axis direction, and superimposes the plurality of divided beams at the surface to be irradiated to cause the superimposed beams to be incident on the incident region.

3. A laser irradiation device comprising:
   a semiconductor laser oscillator having laser diodes arranged two-dimensionally in fast-axis and slow-axis directions; and
   a homogenizer to which a laser beam emitted from the semiconductor laser oscillator is incident, and which is configured to condense the laser beam onto a long-length incident region at a surface to be irradiated,
   wherein the homogenizer divides the laser beam into a plurality of beams with respect to a short-axis direction of the incident region, and superimposes the plurality of divided beams on the surface to be irradiated to cause the superimposed beams to be incident on the incident region,
   the slow-axis direction of the semiconductor laser oscillator is inclined with respect to a long-axis direction of the incident region, and
   wherein an inclined angle $\theta$ is 0.5 times to 1.5 times an inclined angle $\theta_0$, where $\theta$ denotes an inclined angle of the slow-axis direction of the semiconductor laser oscillator with respect to the long axis direction of the incident region, $\theta_0$ denotes the inclined angle $\theta$ at which the standard deviation $\sigma$ shows a minimum value for the first time when the inclined angle $\theta$ is made gradually larger than 0°, and where $\sigma$ denotes the standard deviation of a waveform of an integrated value obtained by integrating light intensity at an incident position of the homogenizer in the long axis direction.

\* \* \* \* \*